US012672438B2

(12) United States Patent
Bang et al.

(10) Patent No.: US 12,672,438 B2
(45) Date of Patent: Jun. 30, 2026

(54) DISPLAY DEVICE

(71) Applicant: Samsung Display Co., LTD., Yongin-si (KR)

(72) Inventors: Kiho Bang, Hwaseong-si (KR); Hee-Sang Park, Cheonan-si (KR); Eunhye Kim, Namyangju-si (KR); Inhyuck Yeo, Asan-si (KR); Eunae Jung, Hwaseong-si (KR); Wonsuk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 530 days.

(21) Appl. No.: 18/170,480

(22) Filed: Feb. 16, 2023

(65) Prior Publication Data

US 2023/0292558 A1     Sep. 14, 2023

(30) Foreign Application Priority Data

Mar. 8, 2022     (KR) ......................... 10-2022-0029368

(51) Int. Cl.
H10K 59/40          (2023.01)
H10K 59/124         (2023.01)
(Continued)

(52) U.S. Cl.
CPC ......... H10K 59/124 (2023.02); H10K 59/131 (2023.02); H10K 59/40 (2023.02); H10K 59/87 (2023.02)

(58) Field of Classification Search
None
See application file for complete search history.

(56) References Cited

U.S. PATENT DOCUMENTS

2018/0358413 A1   12/2018   Lee et al.
2021/0028241 A1   1/2021    Kim et al.
2022/0416006 A1*  12/2022   Choi ..................... G06F 3/0412

FOREIGN PATENT DOCUMENTS

KR     10-2016-0081311 A    7/2016
KR     10-2018-0133706 A    12/2018
(Continued)

OTHER PUBLICATIONS

Korean Office Action, with English translation, dated Dec. 13, 2025, issued in Korean Patent Application No. 10-2022-0029368 (16 pages).

*Primary Examiner* — Kyoung Lee
(74) *Attorney, Agent, or Firm* — Womble Bond Dickinson (US) LLP

(57)          ABSTRACT

A display device includes: a first conductive layer including a gate electrode on an active layer in a display area and a first pad electrode on the substrate in a pad area; a second conductive layer on the first conductive layer in the display area and connected to the active layer; a third conductive layer on the second conductive layer in the display area and including a first connection electrode; a fourth conductive layer on the third conductive layer in the display area and including a second connection electrode connected to the first connection electrode; a light emitting element on the fourth conductive layer in the display area and connected to the second connection electrode; and an upper touch layer including an upper touch electrode on the light emitting element in the display area and a second pad electrode electrically connected to the first pad electrode in the pad area.

20 Claims, 15 Drawing Sheets

(51) Int. Cl.
  *H10K 59/131* (2023.01)
  *H10K 59/80* (2023.01)

(56) References Cited

FOREIGN PATENT DOCUMENTS

| | | | |
|---|---|---|---|
| KR | 10-2021-0011529 | A | 2/2021 |
| KR | 10-2021-0054117 | A | 5/2021 |
| KR | 10-2021-0061326 | A | 5/2021 |
| KR | 10-2021-0131508 | A | 11/2021 |

* cited by examiner

F I G. 1
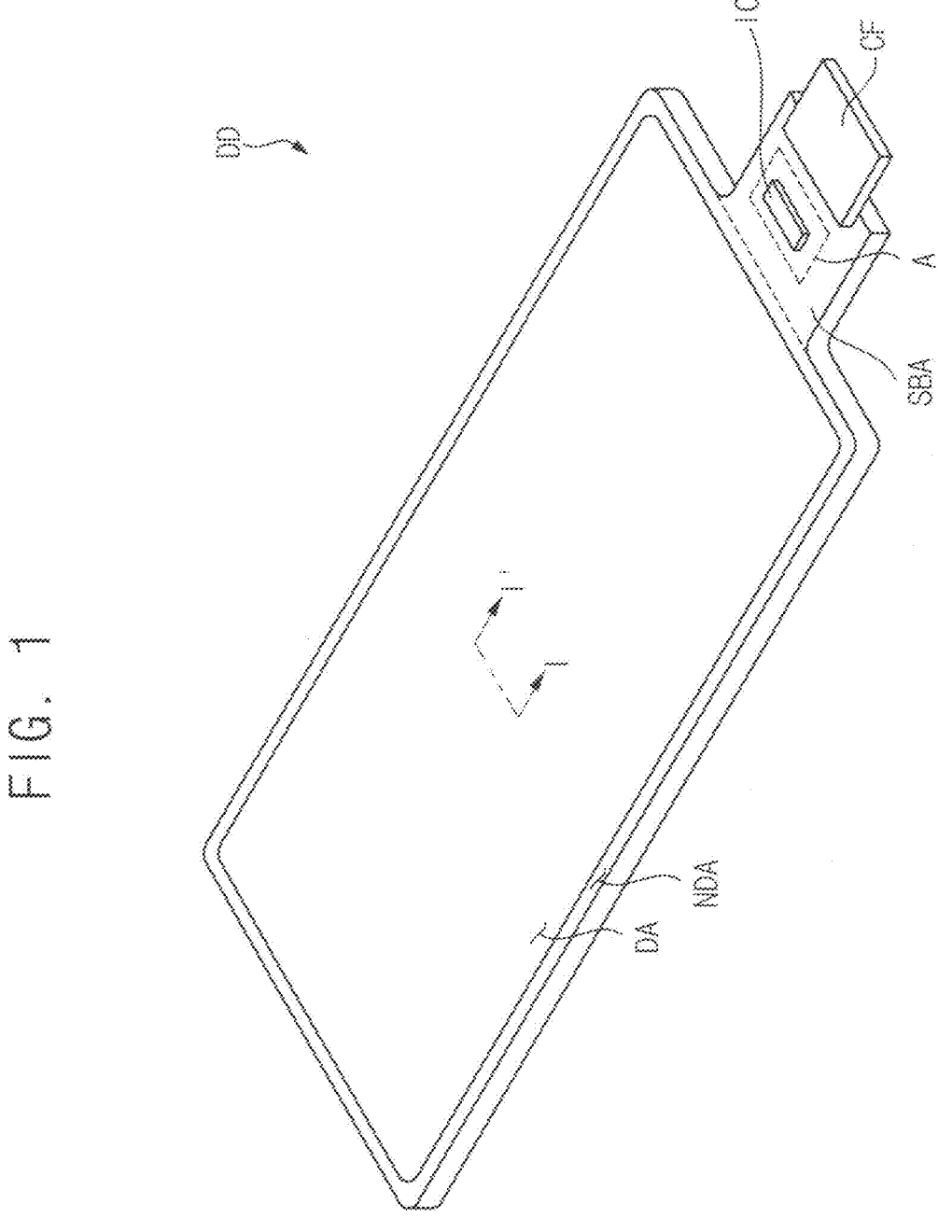

FIG. 7

F I G. 8
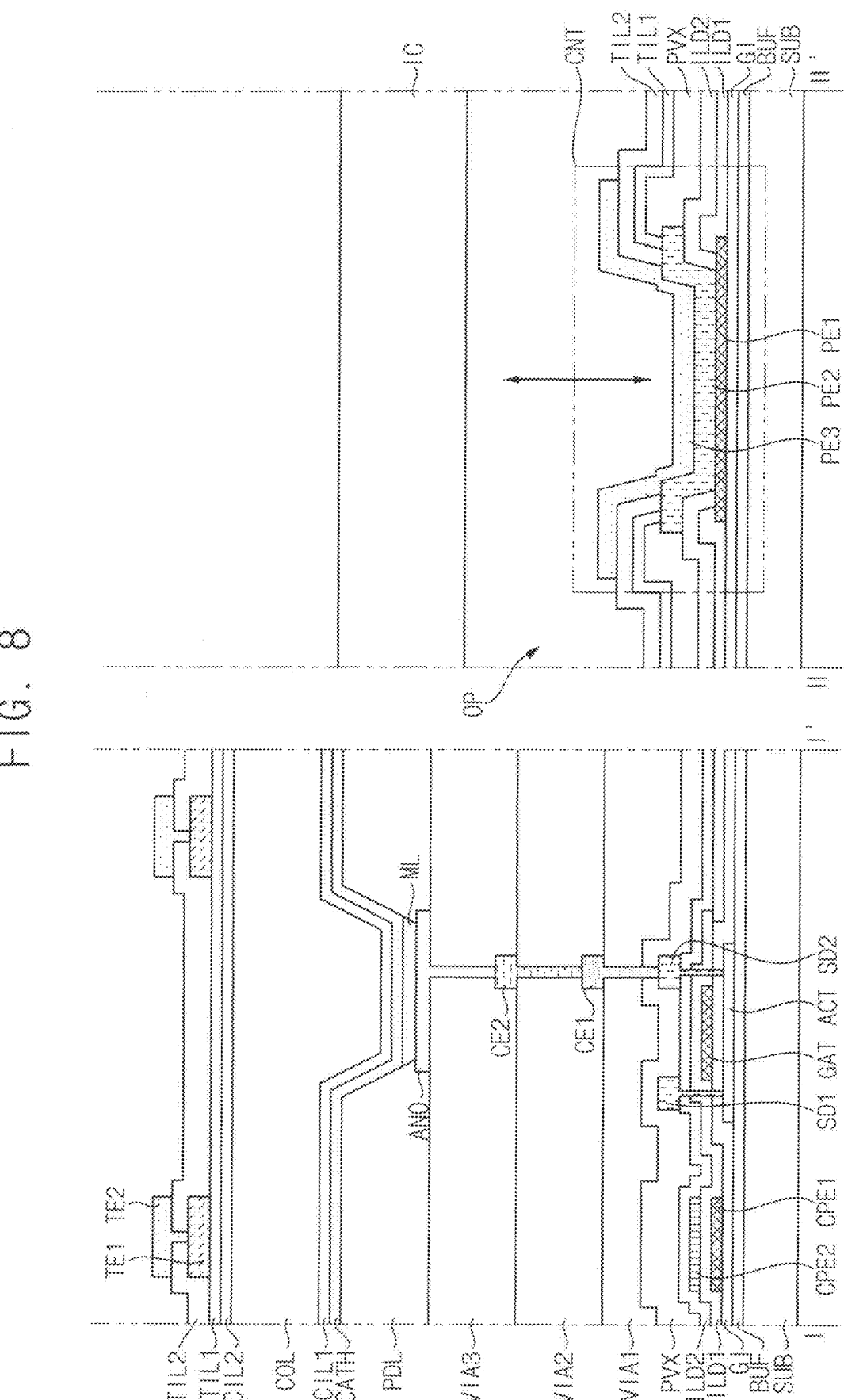

F I G. 10
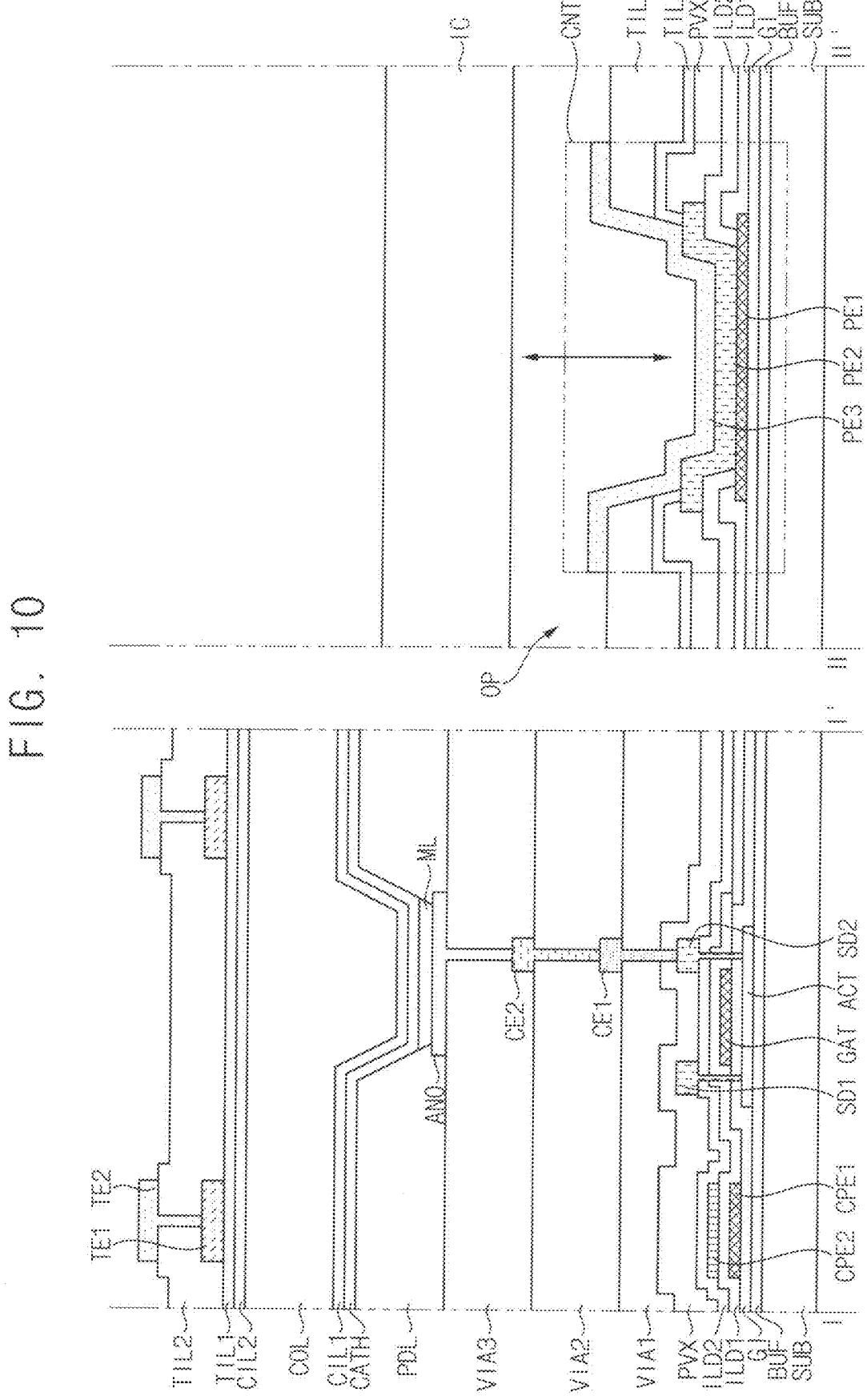

F I G. 15
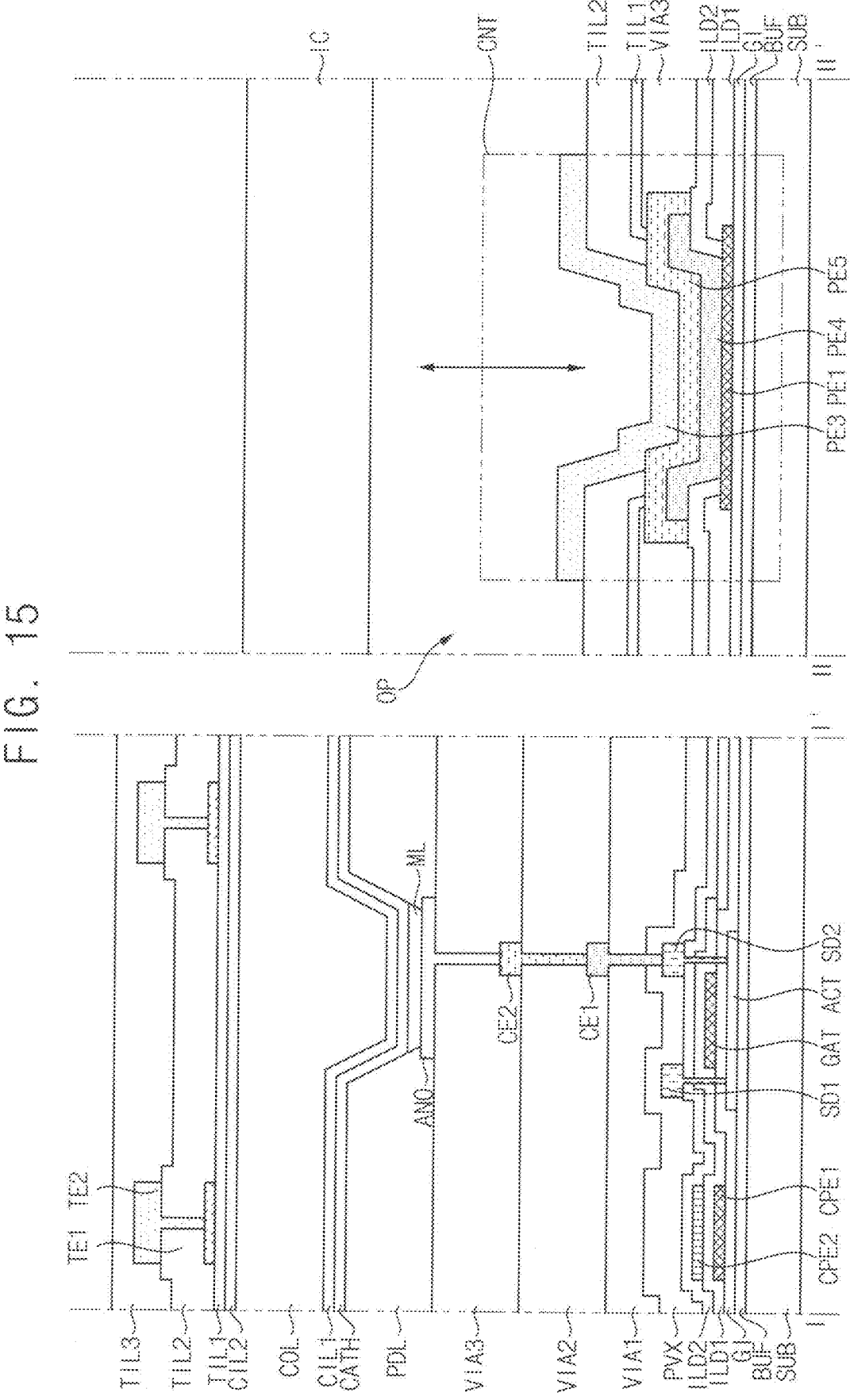

DISPLAY DEVICE

CROSS-REFERENCE TO RELATED APPLICATION

The present application claims priority from and the benefit of Korean Patent Application No. 10-2022-0029368, filed on Mar. 8, 2022, the entire content of which is hereby incorporated herein by reference.

BACKGROUND

1. Field

Aspects of some embodiments relate generally to a display device.

2. Description of the Related Art

A display device may be manufactured and used in various ways. The display device may display visual information to users by emitting light. In order to emit light, the display device may include various light emitting elements. For example, the display device may include a liquid crystal display that emits light using a liquid crystal layer, an inorganic light emitting display that emits light using an inorganic light emitting diode, and an organic light emitting display that emits light using an organic light emitting diode.

The light emitting element may emit light based on a signal applied from the driver. The driver is located in a non-display area positioned around a display area in which the light emitting element is located. In order for the driver to be arranged, a line, a pad, and the like may be positioned in the non-display area.

The above information disclosed in this Background section is only for enhancement of understanding of the background and therefore the information discussed in this Background section does not necessarily constitute prior art.

SUMMARY

Aspects of some embodiments relate generally to a display device. For example, aspects of some embodiments relate to a display device capable of displaying images.

Aspects of some embodiments include a display device capable of displaying an image.

A display device according to embodiments of the present invention may include a substrate including a display area and a non-display area including a pad area, an active layer on the substrate in the display area, a first conductive layer including a gate electrode on the active layer in the display area and a first pad electrode on the substrate in the pad area, a second conductive layer on the first conductive layer in the display area and connected to the active layer, a third conductive layer on the second conductive layer in the display area and including a first connection electrode, a fourth conductive layer on the third conductive layer in the display area and including a second connection electrode connected to the first connection electrode, a light emitting element on the fourth conductive layer in the display area and connected to the second connection electrode, and an upper touch layer including an upper touch electrode on the light emitting element in the display area and a second pad electrode electrically connected to the first pad electrode in the pad area.

According to some embodiments, the second conductive layer may further include: a third pad electrode between the first pad electrode and the second pad electrode to contact the first pad electrode and the second pad electrode in the pad area.

According to some embodiments, the display device may further include a passivation layer between the second conductive layer and the third conductive layer. According to some embodiments, the passivation layer may be to cover both side portions of the third pad electrode and expose a central portion of the third pad electrode. The central portion of the third pad electrode may be in contact with the second pad electrode.

According to some embodiments, the display device may further include a lower touch layer between the upper touch layer and the light emitting element and including a lower touch electrode connected to the upper touch electrode.

According to some embodiments, each of a thickness of the upper touch electrode and a thickness of the second pad electrode may be thinner than a thickness of the lower touch electrode.

According to some embodiments, the display device may further include a touch insulating layer on the upper touch layer. Each of a thickness of the upper touch electrode and a thickness of the second pad electrode may be thinner than a thickness of the lower touch electrode.

According to some embodiments, the display device may further include a first touch insulating layer between the light emitting element and the lower touch layer, and a second touch insulating layer between the lower touch layer and the upper touch layer. The first touch insulating layer and the second touch insulating layer may be sequentially stacked on the passivation layer in the pad area and may expose the central portion of the third pad electrode.

According to some embodiments, each of the passivation layer, the first touch insulating layer, and the second touch insulating layer may include an inorganic insulating material.

According to some embodiments, each of the passivation layer and first touch insulating layer may include an inorganic insulating material, and the second touch insulating layer may include an organic insulating material.

According to some embodiments, the third conductive layer may further include: a third pad electrode between the first pad electrode and the second pad electrode, and in contact with the first pad electrode. The fourth conductive layer may further include: a fourth pad electrode between the second pad electrode and the third pad electrode, and in contact with the second pad electrode and the third pad electrode.

According to some embodiments, the display device may further include a lower touch layer between the upper touch layer and the light emitting element and including a lower touch electrode connected to the upper touch electrode.

According to some embodiments, each of a thickness of the upper touch electrode and a thickness of the second pad electrode may be thinner than a thickness of the lower touch electrode.

According to some embodiments, the display device may further include an insulating layer on the upper touch layer. Each of a thickness of the upper touch electrode and a thickness of the second pad electrode may be greater than a thickness of the lower touch electrode.

According to some embodiments, the display device may further include a first touch insulating layer between the light emitting element and the lower touch layer, and a second touch insulating layer between the lower touch layer and the upper touch layer. The first touch insulating layer and the second touch insulating layer may cover both side portions of the fourth pad electrode and may expose a central portion of the fourth pad electrode in the pad area. The first pad electrode may be in contact with the central portion of the fourth pad electrode.

According to some embodiments, each of the first touch insulating layer and the second touch insulating layer may include an inorganic insulating material.

According to some embodiments, the first touch insulating layer may include an inorganic insulating material, and the second touch insulating layer may include an organic insulating material.

According to some embodiments, the display device may further include an insulating layer between the fourth conductive layer and the light emitting element. The insulating layer may cover both side portions of the fourth pad electrode in the pad area and may expose a central portion of the fourth pad electrode, and the second pad electrode may be in contact with the central portion of the fourth pad electrode.

According to some embodiments, the display device may further include: a lower touch layer between the upper touch layer and the light emitting element and including a lower touch electrode connected to the upper touch electrode, a first touch insulating layer between the light emitting element and the lower touch layer, and a second touch insulating layer between the lower touch layer and the upper touch layer. The first touch insulating layer and the second touch insulating layer may expose the central portion of the fourth pad electrode in the pad area.

According to some embodiments, the display device may further include an integrated circuit electrically connected to the second pad electrode. The integrated circuit and the second pad electrode may be electrically connected to each other by a conductive film.

According to some embodiments, the first conductive layer may further include: a first capacitor electrode. The display device may further include a fifth conductive layer between the first conductive layer and the second conductive layer and the second conductive layer and including a second capacitor electrode overlapping the first capacitor electrode.

In order to achieve the above characteristics of some embodiments of the present invention, a display device according to some embodiments of the present invention includes a plurality of conductive layers located in a display area, and only some conductive layers among the plurality of conductive layers may be used in the pad area. Accordingly, a step coverage defect may be minimized or reduced and a short in the pad area may be prevented or reduced.

BRIEF DESCRIPTION OF THE DRAWINGS

Illustrative, non-limiting embodiments will be more clearly understood from the following detailed description in conjunction with the accompanying drawings.

FIG. 1 is a plan view illustrating a display device according to some embodiments.

FIGS. 7, 8, 9, 10, 11, 12, 13, 14, 15, and 16 are cross-sectional views illustrating embodiments taken along the line I-I' of FIG. 1 and the line II-II' of FIG. 2.

DETAILED DESCRIPTION

Figure 2:
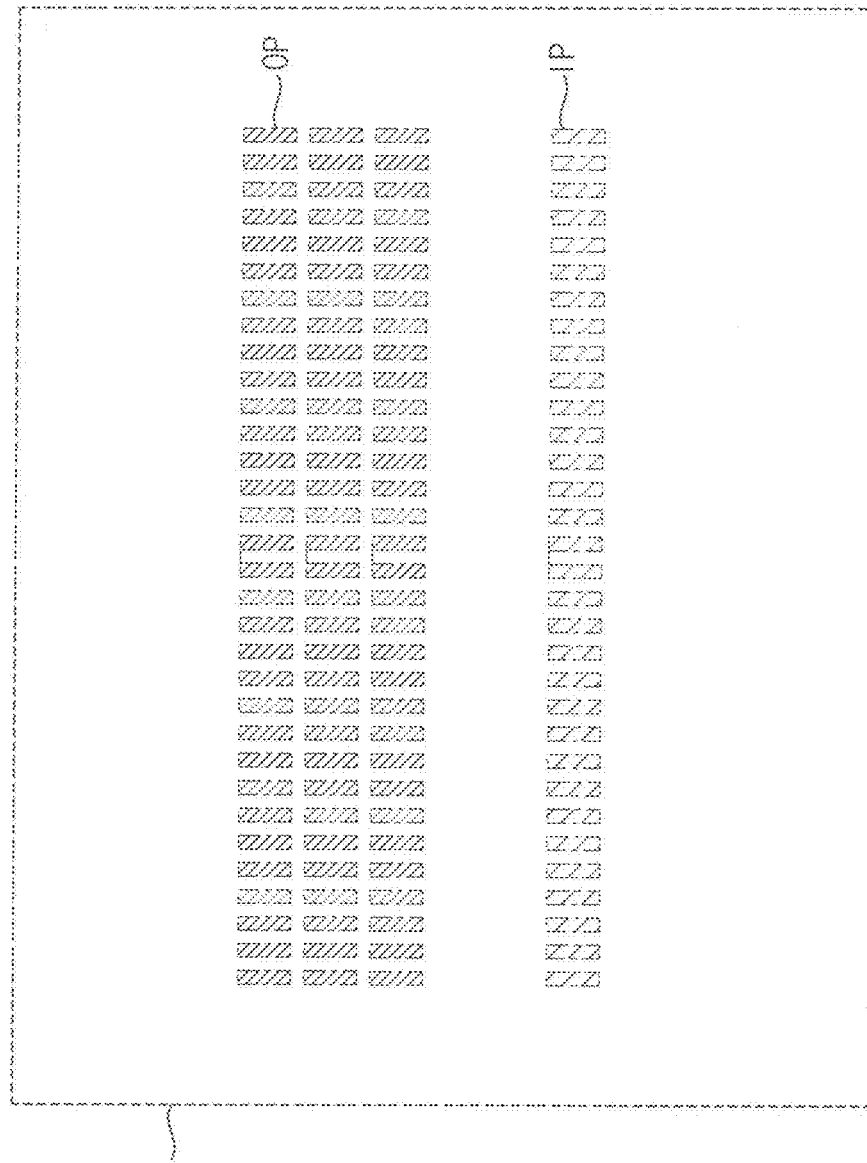
FIGS. 2 and 3 are enlarged views schematically illustrating an area 'A' of the display device of FIG. 1.

Hereinafter, embodiments of the present disclosure will be explained in detail with reference to the accompanying drawings. The same reference numerals are used for the same components in the drawings, and some redundant descriptions of the same components may be omitted.

FIG. 1 is a plan view illustrating a display device according to some embodiments.

Referring to FIG. 1, the display device DD may include a display area DA and a non-display area NDA. The display area DA may be defined as an area configured to emit light. The non-display area NDA may be defined as an area in which components for transmitting signals transmitted to the display area DA are located. That is, the non-display area NDA may be an area in a periphery (e.g., outside a footprint) of the display area DA and may be, for example, a bezel area, where images are not displayed.

A plurality of pixels may be located in the display area DA. The plurality of pixels may emit light based on a signal transmitted from the non-display area NDA. The plurality of pixels may be generally located in the display area DA. Accordingly, the display area DA may display an image by emitting light from an entire area.

A plurality of drivers may be located in the non-display area NDA. The plurality of drivers may generate and transmit signals for driving the plurality of pixels, such as a gate signal, a light emitting signal, a data signal, a power voltage, an initialization voltage, and the like.

The non-display area NDA may include a pad area SNA. In a finished product, the pad area SBA may be bent to be positioned on a rear surface of the display device DD. That is, the pad area SBA may not be viewed from a front of the completed display device DD. An integrated circuit IC and a circuit film CF may be located in the pad area SBA. The integrated circuit IC and the circuit film CF may be connected to the pad area SBA by a conductive film. The integrated circuit IC and the circuit film CF may generate and transmit signals transmitted to the plurality of pixels.

Although a chip on plastic ("COP") method or a chip on glass ("COG") method or arrangement is illustrated as a method in which the integrated circuit IC is formed in FIG. 1, the integrated circuit IC may be arranged in a chip on film ("COF") arrangement.

Figure 3:
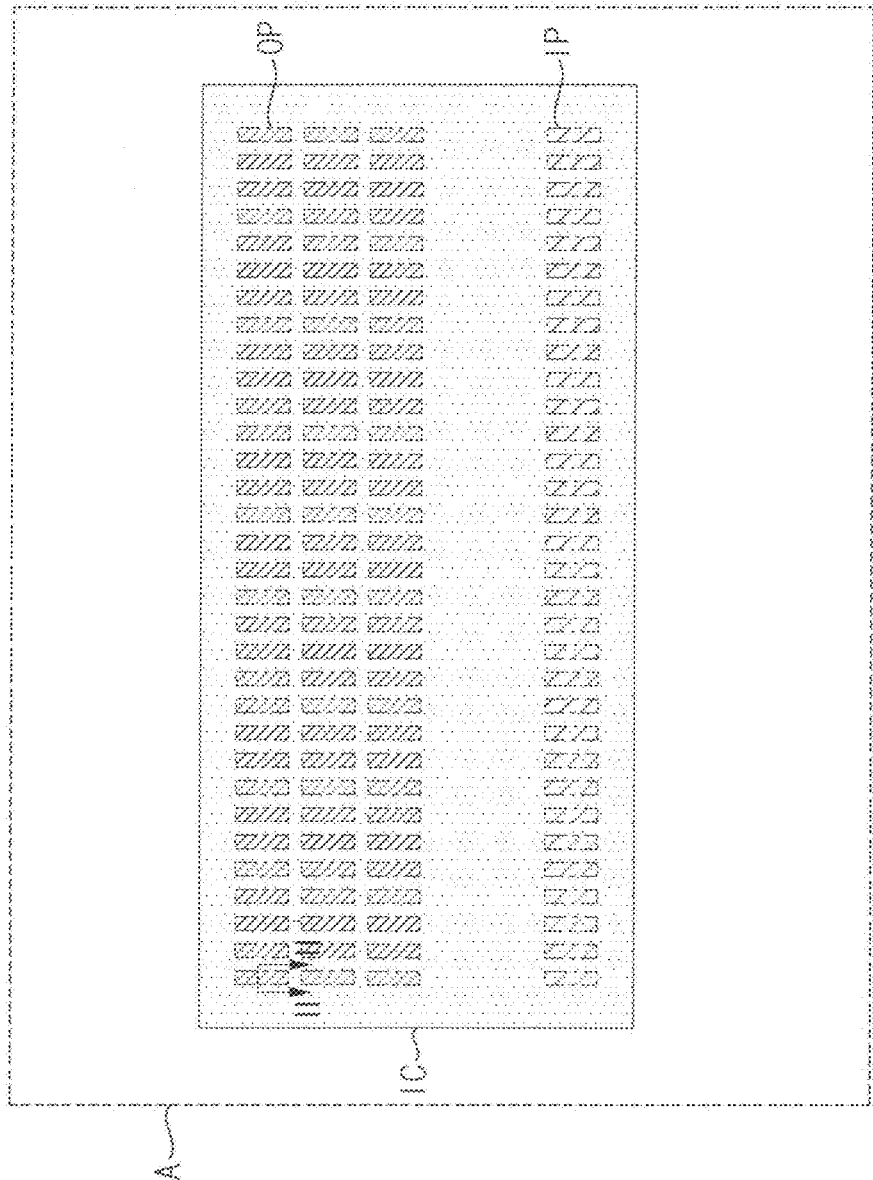

FIGS. 2 and 3 are enlarged views schematically illustrating an area 'A' of the display device of FIG. 1.

Referring to FIGS. 1 and 2, a plurality of pads OP and IP may be located in the pad area SBA. The plurality of pads OP and IP may include output pads OP and input pads IP. The input pads IP may be arranged or formed such that they are spaced apart from each other in one line in one direction. The output pads OP may be arranged or formed such that they are spaced apart from each other in three rows in the one direction. However, this is an example, and the input pads IP may be arranged in two or more rows, and the output pads IP may also be arranged in one or two rows or more.

Referring to FIG. 3 together, the integrated circuit IC may be located on the plurality of pads OP and IP. The integrated circuit IC may be connected to the plurality of pads OP and IP by the conductive film. The integrated circuit IC may output an output signal generated based on an input signal received by the input pads IP through the output pads OP.

Figure 4:
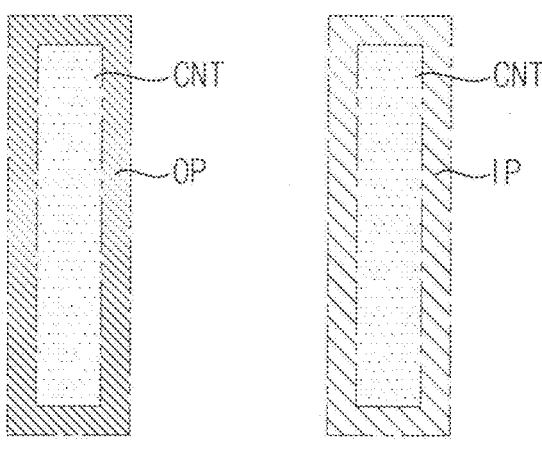
FIGS. 4 and 5 are diagrams illustrating embodiments of pads located in the area 'A' of the display device of FIG. 1.
Figure 5:
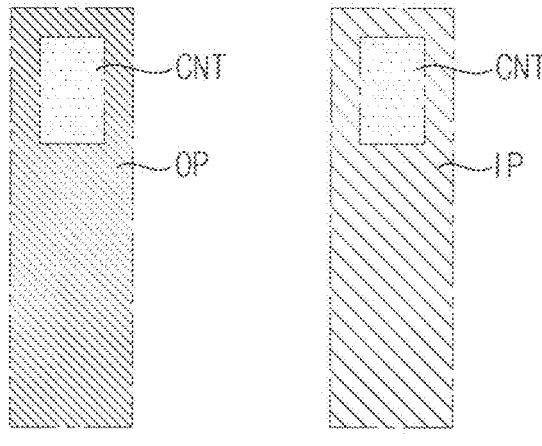

FIGS. 4 and 5 are diagrams illustrating embodiments of pads located in the area 'A' of the display device of FIG. 1.

Referring to FIGS. 4 and 5, each of the output pad OP and the input pad IP may include a contact portion CNT. The contact portion CNT may be defined as an area in which a conductive layer is exposed among the plurality of pads OP and IP. The contact part CNT may be electrically connected to the integrated circuit IC by the conductive film. In this case, the contact portion CNT may be formed in various sizes. For example, as shown in FIG. 4, the contact portion CNT may be formed to be elongated in one direction to have a shape similar a shape of the plurality of pads OP and IP. Alternatively, as shown in FIG. 5, the contact portion CNT may be formed in only some of the plurality of pads OP and IP. However, this is only an example, and two or more of the contact portions CNT may be formed on the plurality of pads OP and IP, respectively, or may be freely formed in a shape different from the illustrated shape.

Figure 6:
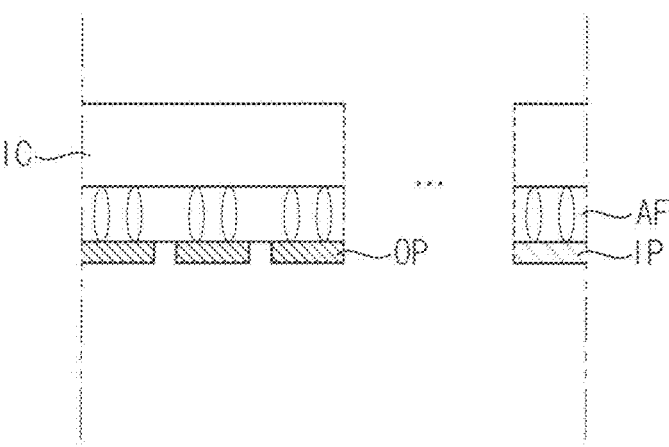
FIG. 6 is a diagram illustrating embodiments in which an integrated circuit is located on pads arranged in the area 'A' of the display device of FIG. 1.

FIG. 6 is a diagram illustrating embodiments in which an integrated circuit is located on pads arranged in the area 'A' of the display device of FIG. 1.

Referring to FIG. 6, the plurality of pads OP and IP may be electrically connected to the integrated circuit IC by a conductive film AF. For example, the conductive film AF may be an anisotropic conductive film.

FIGS. 7, 8, 9, 10, 11, 12, 13, 14, 15, and 16 are cross-sectional views illustrating embodiments taken along the line I-I' of FIG. 1 and the line II-II' of FIG. 2.

Figure 7:
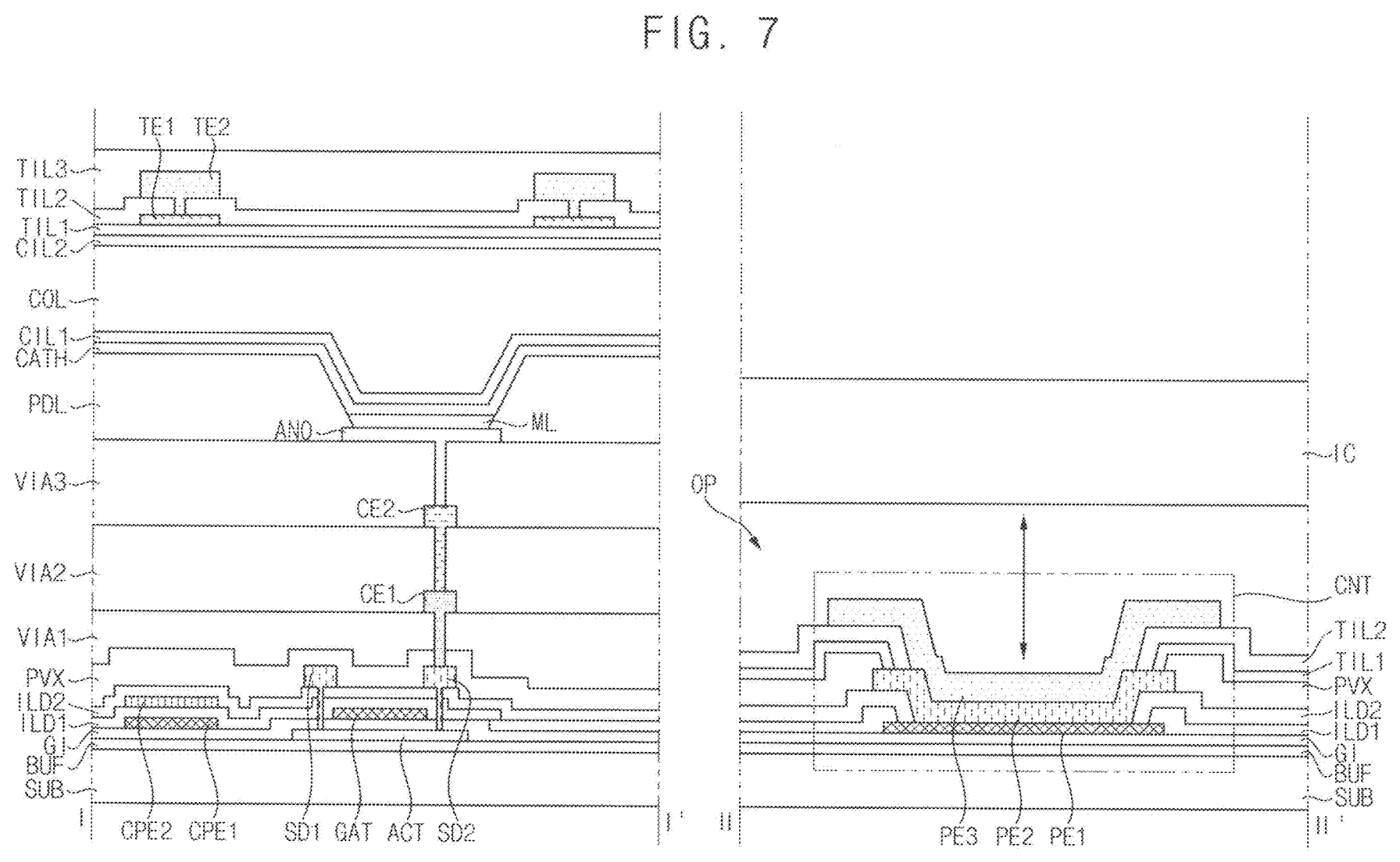

Referring to FIGS. 1, 2, and 7, the display device DD may include a substrate SUB, a buffer layer BUF, an active layer ACT, a gate insulating layer GI, a first conductive layer, and a first interlayer insulation. layer ILD1, a second interlayer insulating layer ILD2, second conductive layer, a third conductive layer, a passivation layer PVX, a first via insulating layer VIA1, a fourth conductive layer, a second via insulating layer VIA2, a fifth conductive layer, a third via insulating layer VIA3, a light emitting element, a pixel defining layer PDL, a thin film encapsulation layer, a first touch insulating layer TIL1, a first touch layer, a second touch insulating layer TIL2, a second touch layer, and a third touch insulating layer TIL3.

The substrate SUB may include the display area DA and the non-display area NDA. The substrate SUB may include a flexible material or a rigid material. For example, the substrate SUB may include a polymer material such as polyimide, and in this case, the substrate SUB may have a flexible characteristic. Alternatively, for example, the substrate SUB may include a material such as glass, and in this case, the substrate SUB may have a rigid characteristic.

The buffer layer BUF may be located on the substrate SUB. The buffer layer BUF may include an inorganic insulating material. Examples of the material that can be used as the buffer layer BUF may include silicon oxide ($SiO_x$), silicon nitride ($SiN_x$), silicon oxynitride (SiON), and the like. These may be used alone or in combination with each other. The buffer layer BUF may prevent or reduce instances of metal atoms, contaminants, or impurities diffusing into the active layer ACT. In addition, the buffer layer BUF may control the rate of heat provided to the active layer ACT during a crystallization process for forming the active layer ACT.

The active layer ACT may be located on the buffer layer BUF. The active layer ACT may be located only in the display area DA. The active layer ACT may include a semiconductor material. For example, the semiconductor material may be a silicon semiconductor or an oxide semiconductor.

The gate insulating layer GI may be located on the buffer layer BUF to cover the active layer ACT. The gate insulating layer GI may include an inorganic insulating material. Examples of the material that can be used as the gate insulating layer GI may include silicon oxide ($SiO_x$), silicon nitride ($SiN_x$), silicon oxynitride (SiON), and the like. These may be used alone or in combination with each other.

The first conductive layer may be located on the gate insulating layer GI. The first conductive layer may include a first capacitor electrode CPE1, a gate electrode GAT, and a first pad electrode PE1. The first capacitor electrode CPE1 and the gate electrode GAT may be located in the display area DA. The gate electrode GAT may be arranged to overlap the active layer ACT. Based on a signal applied to the gate electrode GAT, the active layer ACT may be activated. The first capacitor electrode CPE1 may constitute a capacitor together with a second capacitor electrode CPE2 to be described later. The first pad electrode PE1 may be located in the pad area SBA.

The first conductive layer may include a metal, an alloy, a metal oxide, a transparent conductive material, and the like. Examples of the material that can be used as the first conductive layer may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The first interlayer insulating layer ILD1 may cover the first conductive layer and be located on the gate insulating layer GI. The first interlayer insulating layer ILD1 may include an inorganic insulating material. Examples of the material that can be used as the first interlayer insulating layer ILD1 may include silicon oxide ($SiO_x$), silicon nitride ($SiN_x$), silicon oxynitride (SiON), and the like. These may be used alone or in combination with each other. The first interlayer insulating layer ILD1 may expose the first pad electrode PE1 in the pad area SBA.

The second conductive layer may be located on the first interlayer insulating layer ILD1. The second conductive layer may include the second capacitor electrode CPE2. The second capacitor electrode CPE2 may be arranged to overlap the first capacitor electrode CPE1. The first capacitor electrode CPE1 and the second capacitor electrode CPE2 may constitute the capacitor.

The second conductive layer may include a metal, an alloy, a metal oxide, a transparent conductive material, and the like. Examples of the material that can be used as the second conductive layer may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The second interlayer insulating layer ILD2 may cover the second conductive layer and may be located on the first interlayer insulating layer ILD1. The second interlayer insulating layer ILD2 may include an inorganic insulating material. Examples of the material that can be used as the second interlayer insulating layer ILD2 may include silicon oxide ($SiO_x$), silicon nitride ($SiN_x$), silicon oxynitride (SiON), and the like. These may be used alone or in combination with each other. The second interlayer insulating layer ILD2 may expose the first pad electrode PE1 in the pad area SBA.

The third conductive layer may be located on the second interlayer insulating layer ILD2. The third conductive layer may include a source electrode SE, a drain electrode DE, and a second pad electrode PE2. The source electrode SE and the drain electrode DE may be located in the display area DA. The source electrode SE and the drain electrode DE may be electrically connected to the active layer ACT, respectively. The source electrode SE and the drain electrode DE may be electrically connected to each other when the signal is applied to the gate electrode GAT. The active layer ACT, the gate electrode GAT, the source electrode SE, and the drain electrode DE may constitute a transistor. The second pad electrode PE2 may be located in the pad area SBA. The second pad electrode PE2 may be located on the first pad electrode PE1 and may be in contact with the first pad electrode PE1.

The third conductive layer may include a metal, an alloy, a metal oxide, a transparent conductive material, and the like. Examples of the material that can be used as the third conductive layer may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The passivation layer PVX may be located on the second interlayer insulating layer ILD2 to cover the third conductive layer. The passivation layer PVX may be arranged to cover both side portions of the second pad electrode PE2. The passivation layer PVX may expose a central portion of the second pad electrode PE2. In this case, because the passivation layer PVX is arranged to cover both side portions of the second pad electrode PE2, damage to both side portions of the second pad electrode PE2 by etching process may be prevented or reduced. The passivation layer PVX may include an inorganic insulating material. Examples of the material that can be used as the passivation layer (PVX) may include silicon oxide ($SiO_x$), silicon nitride ($SiN_x$), silicon oxynitride (SiON), and the like. These may be used alone or in combination with each other.

The first via insulating layer VIA1 may be located on the passivation layer PVX. The first via insulating layer VIA1 may be located only in the display area DA and may not be located in the pad area SBA. The first via insulating layer VIA1 may include an organic insulating material. Examples of materials that can be used as the first via insulating layer VIA1 may include polyacrylic resins, polyimide-based resins, acrylic resins, and the like. These may be used alone or in combination with each other.

The fourth conductive layer may be located on the first via insulating layer VIA1. The fourth conductive layer may include a first connection electrode CE1. The first connection electrode CE1 may be electrically connected to the drain electrode DE. The fourth conductive layer may include a metal, an alloy, a metal oxide, a transparent conductive material, and the like. Examples of the material that can be used as the fourth conductive layer may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The second via insulating layer VIA2 may cover the fourth conductive layer and may be located on the first via insulating layer VIA1. The second via insulating layer VIA2 may be located only in the display area DA and may not be located in the pad area SBA. The second via insulating layer VIA2 may include an organic insulating material. Examples of materials that can be used as the second via insulating layer VIA2 may include polyacrylic resins, polyimide resins, acrylic resins, and the like. These may be used alone or in combination with each other.

The fifth conductive layer may be located on the second via insulating layer VIA2. The fifth conductive layer may include a second connection electrode CE2. The second connection electrode CE2 may be electrically connected to the first connection electrode CE1. The fifth conductive layer may include a metal, an alloy, a metal oxide, a transparent conductive material, and the like. Examples of the material that can be used as the fifth conductive layer include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The third via insulating layer VIA3 may cover the fifth conductive layer and may be located on the second via insulating layer VIA2. The third via insulating layer VIA3 may be located only in the display area DA and may not be located in the pad area SBA. The third via insulating layer VIA3 may include an organic insulating material. Examples of the material that can be used as the third via insulating layer VIA3 may include polyacrylic resin, polyimide resin, acrylic resin, and the like. These may be used alone or in combination with each other.

An anode electrode ANO, an intermediate layer ML, and a cathode electrode CATH may constitute the light emitting element.

The anode electrode ANO may be located on the third via insulating layer VIA3. The anode electrodes ANO may be connected to the second connection electrode CE2. Each of the anode electrodes ANO may include a metal, an alloy, a metal oxide, a transparent conductive material, and the like. Examples of materials that can be used as the anode electrode (ANO) may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like.

The pixel defining layer PDL may be located on the third via insulating layer VIA3. An opening exposing the anode electrode ANO may be formed in the pixel defining layer PDL. The pixel defining layer PDL may include an organic material. Examples of the material that can be used as the pixel defining layer PDL may include polyacrylic resins, polyimide-based resins, acrylic resins, and the like.

The intermediate layer ML may be located on the anode electrode ANO. The intermediate layer ML may include an organic material emitting light of a color (e.g., a set or predetermined color). The intermediate layer ML may emit light based on a potential difference between the anode electrode ANO and the cathode electrode CATH. To this end, the intermediate layer ML may include an electron injection layer, an electron transport layer, a light emitting layer, a hole transport layer, and a hole injection layer.

The cathode electrode CATH may be arranged to cover the intermediate layer ML and the pixel defining layer PDL. The cathode electrode CATH may include silver metal, an alloy, a metal oxide, a transparent conductive material, and the like. Examples of the material that can be used as the cathode electrodes CATH include silver (Ag), an alloy containing silver, molybdenum (Mo), an alloy containing molybdenum, aluminum (Al), an alloy containing aluminum alloy, aluminum nitride (AlN), tungsten (W), tungsten nitride (WN), copper (Cu), nickel (Ni), chromium (Cr), chromium nitride (CrN), titanium (Ti), tantalum (Ta), Platinum (Pt), scandium (Sc), indium-tin oxide (ITO), indium-zinc oxide (IZO), and the like.

The thin film encapsulation layer may be located on the light emitting element. The thin film encapsulation layer may have a structure in which a first inorganic encapsulation layer CIL1, an organic encapsulation layer COL, and a second inorganic encapsulation layer CIL2 are sequentially stacked. The first inorganic encapsulation layer CIL1 and the second inorganic encapsulation layer CIL2 may include an inorganic insulating material. The organic encapsulation layer COL may include an organic insulating material. The thin film encapsulation layer may serve to protect the light emitting element from penetration, contamination, and/or impact from external foreign substances.

The first touch insulating layer TIL1 may be located on the thin film encapsulation layer. The first touch insulating layer TIL1 may expose a central portion of the second pad electrode PE2 in the pad area SBA. The first touch insulating layer TIL1 may include an inorganic insulating material. Examples of the material that can be used as the first touch insulating layer TIL1 may include silicon oxide (SiO$_x$), silicon nitride (SiN$_x$), silicon oxynitride (SiON), and the like. These may be used alone or in combination with each other.

The first touch layer may be located on the first touch insulating layer TIL1. The first touch layer may be defined as a lower touch layer. The first touch layer may include a plurality of first touch electrodes TE1. The first touch layer may include a metal, an alloy, a metal oxide, a transparent conductive material, and the like. Examples of the material that can be used as the first touch layer include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium-tin oxide (ITO), indium-zinc oxide (IZO), and the like.

The second touch insulating layer TIL2 may cover the first touch layer and may be located on the first touch insulating layer TIL1. The second touch insulating layer TIL2 may expose the central portion of the second pad electrode PE2 in the pad area SBA. The second touch insulating layer TIL2 may include an inorganic insulating material. Examples of the material that can be used as the second touch insulating layer TIL2 may include silicon oxide (SiO$_x$), silicon nitride (SiN$_x$), silicon oxynitride (SiON), and the like. These may be used alone or in combination with each other.

The second touch layer may be located on the second touch insulating layer TIL2. The second touch layer may be defined as an upper touch layer. The second touch layer may include a plurality of second touch electrodes TE2 and a third pad electrode PE3. The second touch electrodes TE2 may be located in the display area DA. The second touch electrodes TE2 may be connected to the first touch electrodes TE1. The first touch electrodes TE1 and the second touch electrodes TE2 may detect an external touch and transmit the external touch to a touch driver. The third pad electrode PE3 may be located in the pad area SBA. The third pad electrode PE3 may contact the second pad electrode PE2. An exposed area of the third pad electrode PE3 may constitute the contact portion CNT.

The second touch layer may include a metal, an alloy, a metal oxide, a transparent conductive material, and the like. Examples of the material that can be used as the second touch layer may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium-tin oxide (ITO), indium-zinc oxide (IZO), and the like.

The second touch layer may serve to sense the external touch, and the first touch layer may serve as a bridge for transmitting a signal transmitted to the second touch layer. In order to effectively recognize the external touch, the upper second touch layer may be formed to be thicker than the first touch layer. For example, the second touch layer may be thicker than the first touch layer by about 1000 angstroms.

The third touch insulating layer TIL3 may cover the second touch layer and may be located on the second touch insulating layer TIL2. The third touch insulating layer TIL3 may include an organic insulating material. Examples of the material that can be used as the third touch insulating layer TIL3 may include polyacrylic resin, polyimide resin, acrylic resin, and the like. These may be used alone or in combination with each other.

In FIG. 7, the output pad OP is illustrated as a reference, but the structure of FIG. 7 may be substantially identically applied to the input pad IP.

FIG. 8 may be substantially the same as FIG. 7, except that the third touch insulating layer TIL3 is not located. Accordingly, some description of the overlapping configuration may be omitted.

Referring to FIG. 8, because the third touch insulating layer TIL3 is not located, a thickness of the second touch layer may be thinner than a thickness of the first touch layer. In this case, the first touch layer may sense the external touch, and the second touch layer may serve as a bridge for transmitting a signal sensed by the first touch layer. In this case, the first touch layer may be thicker than the second touch layer by about 1000 angstroms. Through this, to sense the external touch while reducing an area that can be touched by the penetration of foreign substances or external impact may be possible.

Figure 9:
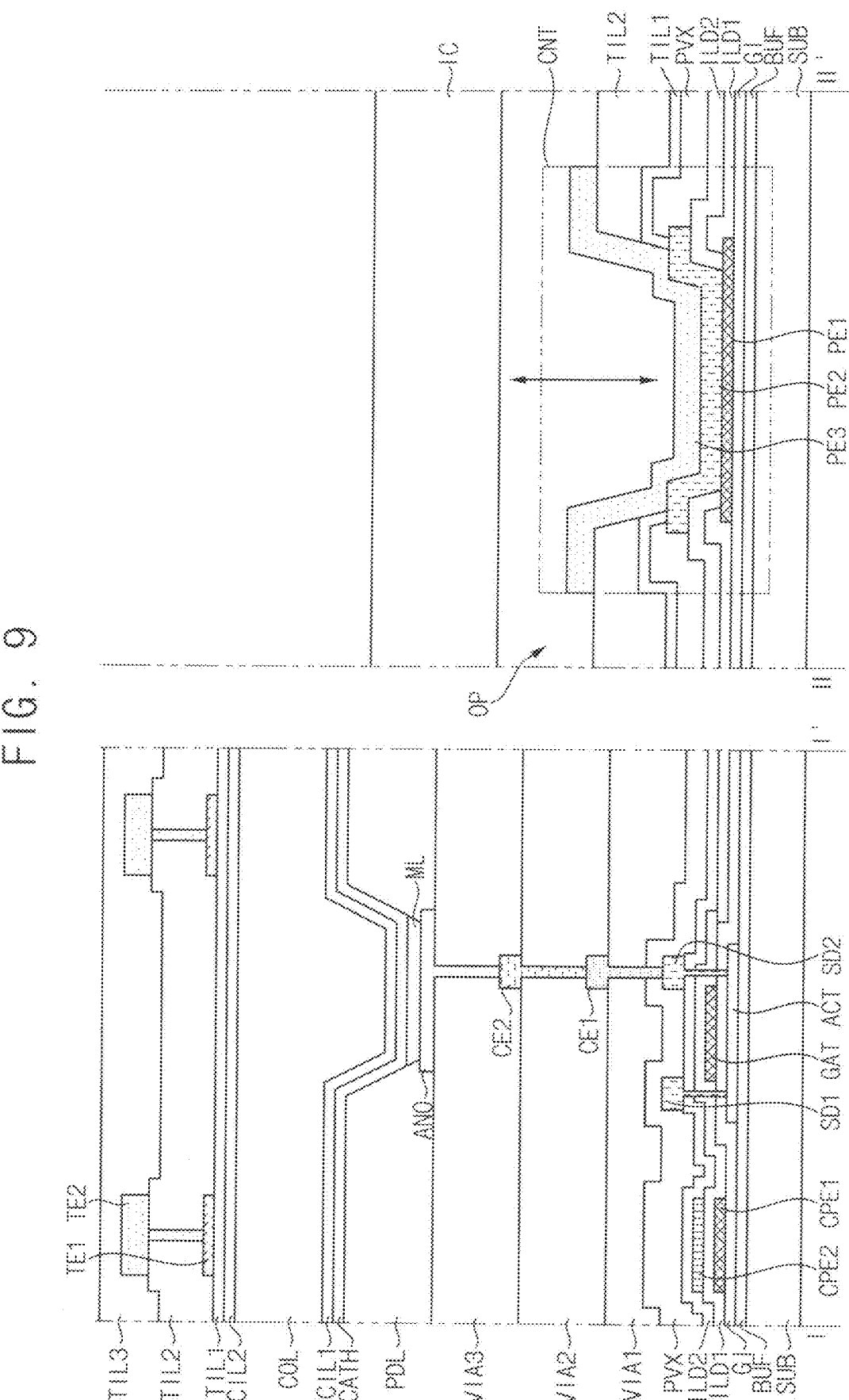

FIG. 9 may be substantially the same as FIG. 7, except that the second touch insulating layer TIL2 includes an organic insulating material. Accordingly, some description of the overlapping configuration may be omitted.

Referring to FIG. 9, the second touch insulating layer TIL2 may include an organic insulating material. In this case, the second touch insulating layer TIL2 may be formed to be thicker than when the inorganic insulating material is included.

FIG. 10 may be substantially the same as FIG. 9, except that the third touch insulating layer TIL3 is not located. Accordingly, some description of the overlapping configuration may be omitted.

Referring to FIG. 10, because the third touch insulating layer TIL3 is not located, the thickness of the second touch layer may be relatively thinner than the thickness of the first touch layer. In this case, the first touch layer may sense an external touch, and the second touch layer may serve as a bridge for transmitting a signal sensed by the first touch layer. In this case, the first touch layer may be thicker than the second touch layer by about 1000 angstroms. Through this, to sense the external touch while reducing an area that can be touched by the penetration of foreign substances or external impact may be possible.

Figure 11:
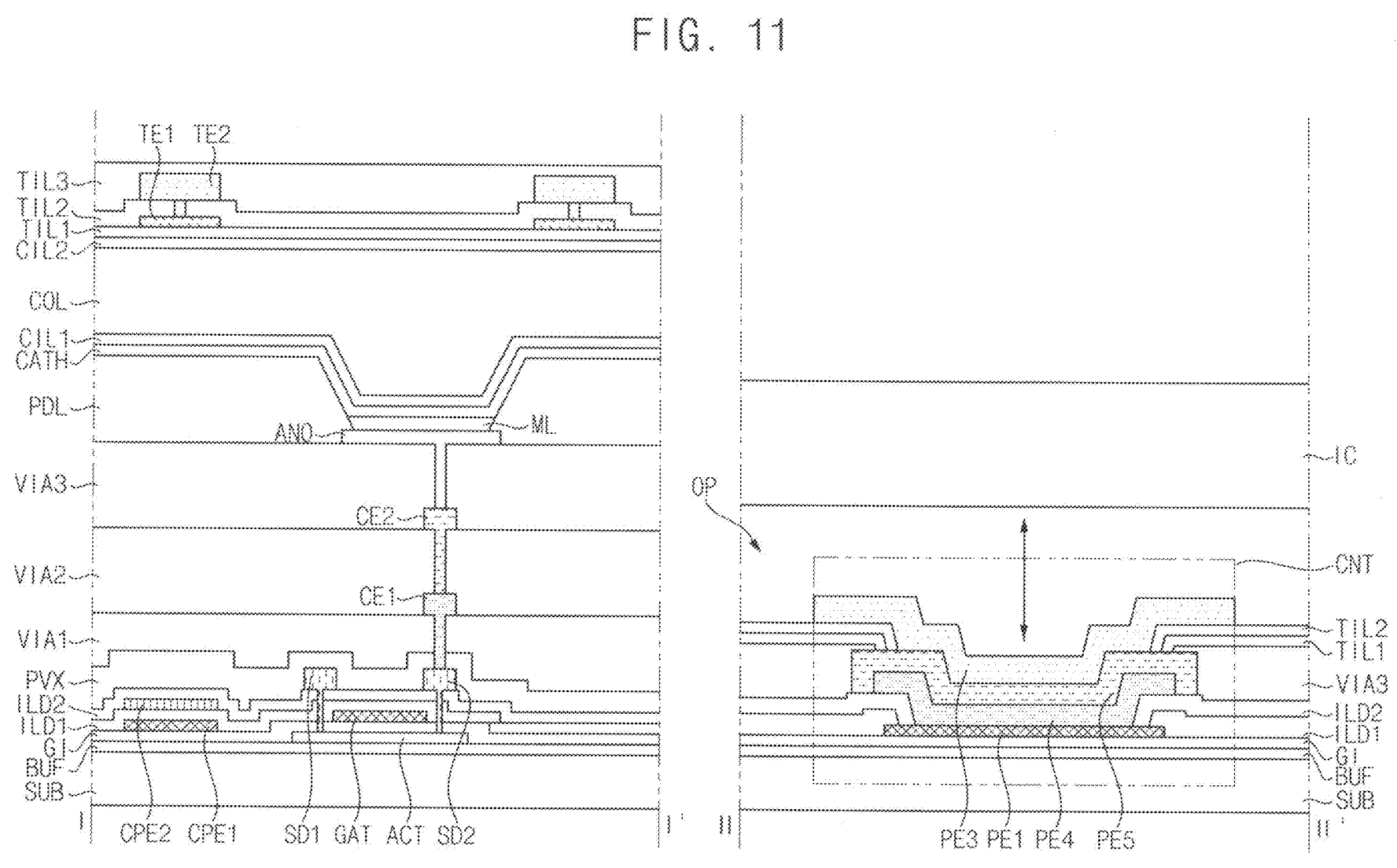

FIG. 11 may be substantially the same as FIG. 7 except for the structure of the output pad OP. Accordingly, some description of the overlapping configuration may be omitted.

Referring to FIG. 11, the fourth conductive layer may further include a fourth pad electrode PE4. The fourth pad electrode PE4 may be located on the first pad electrode PE1 and may be in contact with the first pad electrode PE1.

The fifth conductive layer may further include a fifth pad electrode PE5. The fifth pad electrode PE5 may be located on the fourth pad electrode PE4 and may be in contact with the fourth pad electrode PE4. The third pad electrode PE3 may be located on the fifth pad electrode PE5 to contact the fifth pad electrode PE5. In this case, as a thickness of the contact portion CNT increases, a signal flowing through the contact portion CNT may effectively flow due to low resistance.

In this case, the third via insulating layer VIA3 may be arranged to cover both side portions of the fifth pad electrode PE5. The third via insulating layer VIA3 may prevent or reduce instances of both side portions of the fifth pad electrode PE5 being damaged by etching. For example, the third via insulating layer VIA3 may prevent or reduce instances of the pad electrodes of the pad area SBA being damaged in a process of forming a hole in the display area DA. Because the third via insulating layer VIA3 formed in the pad area SBA is formed by a halftone process, the third via insulating layer VIA3 formed in the display area DA may have a thickness lower than a thickness of the third via insulating layer VIA3 formed in the display area DA.

Figure 12:
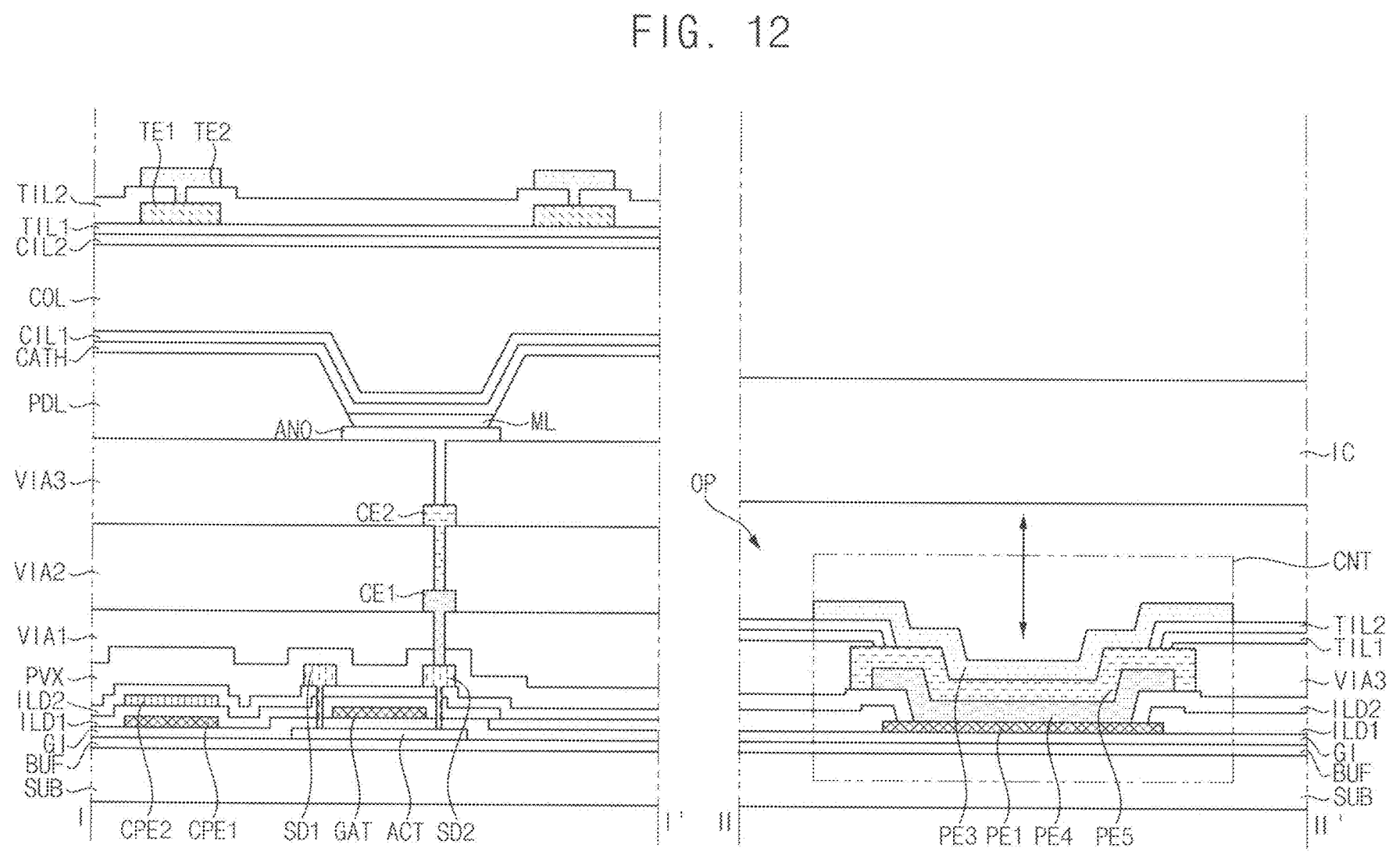

FIG. 12 may be substantially the same as FIG. 11, except that the third touch insulating layer TIL3 is not located. Accordingly, a description of some of the overlapping configuration may be omitted.

Referring to FIG. 12, because the third touch insulating layer TIL3 is not located, the thickness of the second touch layer may be relatively thinner than the thickness of the first touch layer. In this case, the first touch layer may sense an external touch, and the second touch layer may serve as a bridge for transmitting a signal sensed by the first touch layer. In this case, the first touch layer may be thicker than the second touch layer by about 1000 angstroms. Through this, to sense the external touch while reducing an area that can be touched by the penetration of foreign substances or external impact may be possible.

Figure 13:
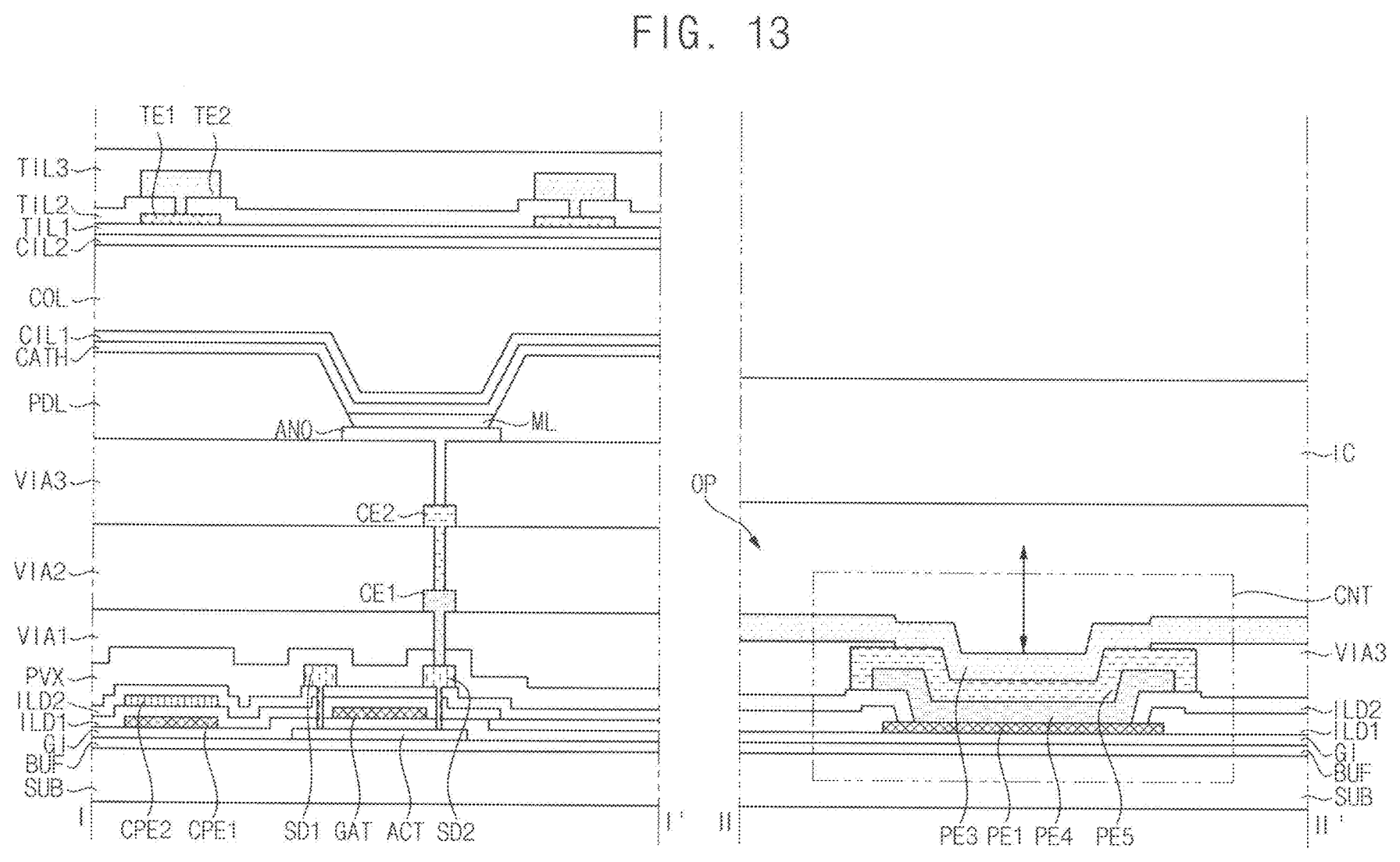

FIG. 13 may be substantially the same as FIG. 11 except for the structure of the output pad OP. Accordingly, some description of the overlapping configuration may be omitted.

Referring to FIG. 13, the third via insulating layer VIA3 may be formed to cover both side portions of the fifth pad electrode PE5. The third via insulating layer VIA3 may expose a central portion of the fifth pad electrode PE5. The third via insulating layer VIA3 may prevent or reduce instances of the pad electrodes of the pad area SBA being damaged in the process of forming the hole in the display area DA.

Figure 14:
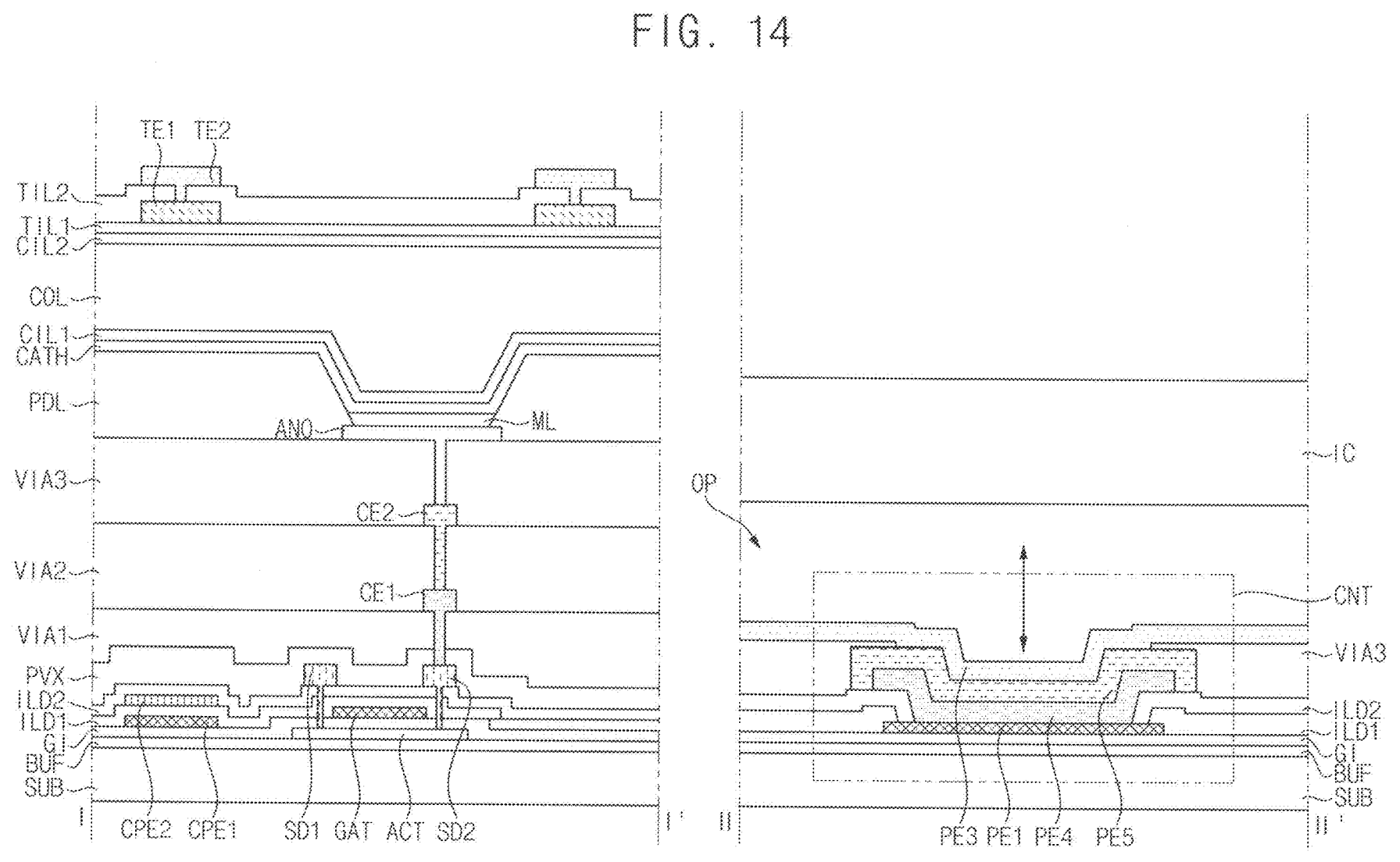

FIG. 14 may be substantially the same as FIG. 13, except that the third touch insulating layer TIL3 is not located. Accordingly, some description of the overlapping configuration may be omitted.

Referring to FIG. 14, because the third touch insulating layer TIL3 is not located, the thickness of the second touch layer may be relatively thinner than the thickness of the first touch layer. In this case, the first touch layer may sense an external touch, and the second touch layer may serve as a bridge for transmitting a signal sensed by the first touch layer. In this case, the first touch layer may be thicker than the second touch layer by about 1000 angstroms. Through this, to sense the external touch while reducing the area that can be touched by the penetration of foreign substances or external impact may be possible.

FIG. 15 may be substantially the same as FIG. 13 except for the structure of the output pad OP. Accordingly, some description of the overlapping configuration may be omitted.

Referring to FIG. 15, the first touch insulating layer TIL1 and the second touch insulating layer TIL2 may be located on the third via insulating layer VIA3. In this case, the first touch insulating layer TIL1 may include an inorganic insulating material, and the second touch insulating layer TIL2 may include an organic insulating material. In this case, the second touch insulating layer TIL2 may be formed to be thicker than the first touch insulating layer TIL1. In this case, the second touch insulating layer TIL2 and the first touch insulating layer TIL1 together with the third via insulating layer VIA3 may protect the pad electrodes from damage due to etching.

Figure 16:
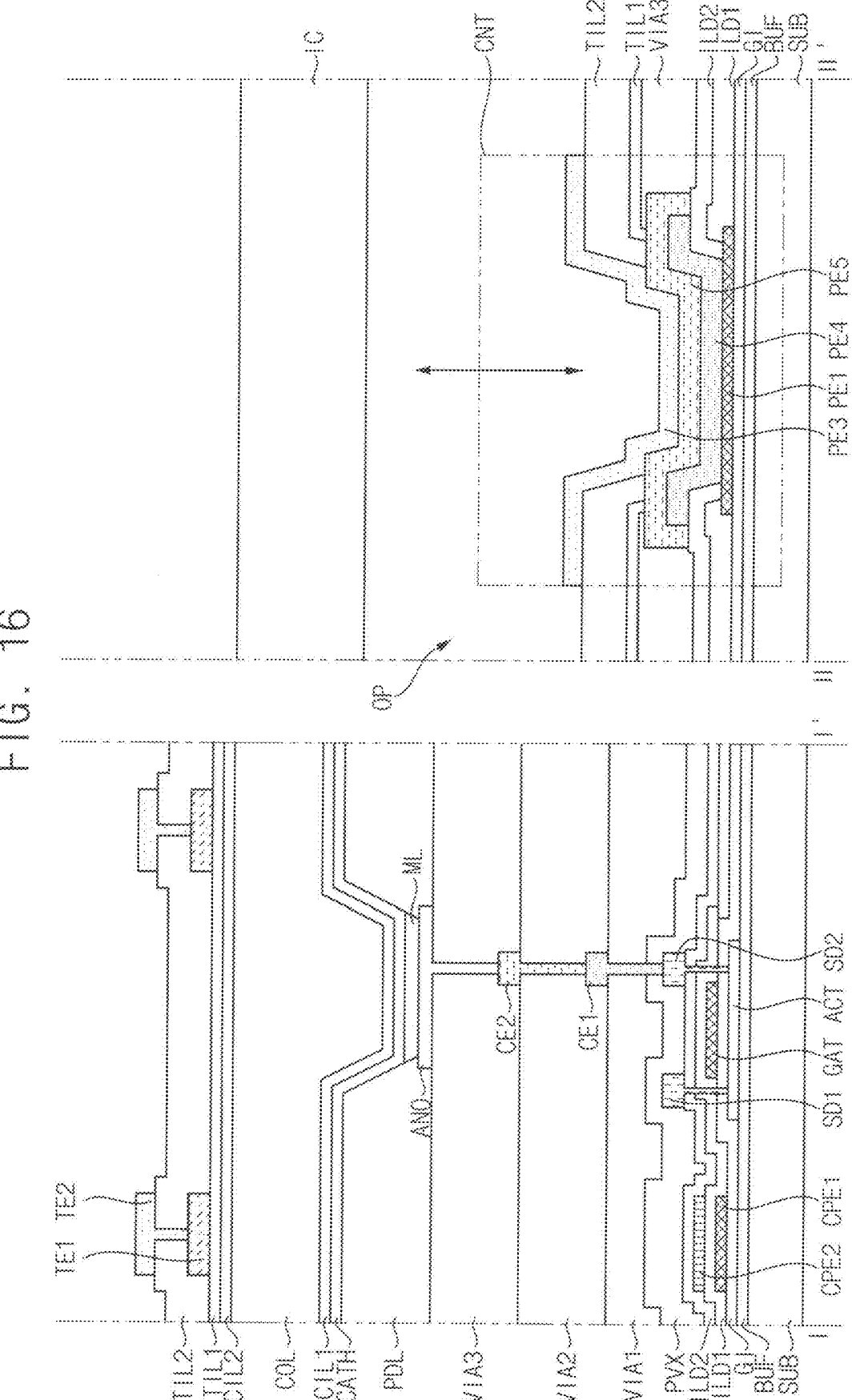

FIG. 16 may be substantially the same as FIG. 15, except that the third touch insulating layer TIL3 is not located. Accordingly, some description of the overlapping configuration may be omitted.

Referring to FIG. 16, because the third touch insulating layer TIL3 is not located, the thickness of the second touch layer may be relatively thinner than the thickness of the first touch layer. In this case, the first touch layer may sense an external touch, and the second touch layer may serve as a bridge for transmitting a signal sensed by the first touch layer. In this case, the first touch layer may be thicker than the second touch layer by about 1000 angstroms. Through this, to sense the external touch while reducing the area that can be touched by the penetration of foreign substances or external impact may be possible.

The present invention can be applied to various display devices. For example, the present invention is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and characteristics of embodiments according to the present disclosure. Accordingly, all such modifications are intended to be included within the scope of the present inventive concept as defined in the claims, and their equivalents. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A display device comprising:
a substrate including a display area and a non-display area including a pad area;
an active layer on the substrate in the display area;
a first conductive layer including a gate electrode on the active layer in the display area and a first pad electrode on the substrate in the pad area;
a second conductive layer on the first conductive layer in the display area and connected to the active layer;
a third conductive layer on the second conductive layer in the display area and including a first connection electrode;
a fourth conductive layer on the third conductive layer in the display area and including a second connection electrode connected to the first connection electrode;
a light emitting element on the fourth conductive layer in the display area and connected to the second connection electrode; and
an upper touch layer including an upper touch electrode on the light emitting element in the display area and a second pad electrode electrically connected to the first pad electrode in the pad area.

2. The display device of claim 1, wherein the second conductive layer further includes:
a third pad electrode between the first pad electrode and the second pad electrode to contact the first pad electrode and the second pad electrode in the pad area.

3. The display device of claim 2, further comprising:
a passivation layer between the second conductive layer and the third conductive layer,
wherein the passivation layer is to cover both side portions of the third pad electrode and expose a central portion of the third pad electrode, and
wherein the central portion of the third pad electrode is in contact with the second pad electrode.

4. The display device of claim 3, further comprising:
a lower touch layer between the upper touch layer and the light emitting element and including a lower touch electrode connected to the upper touch electrode.

5. The display device of claim 4, wherein each of a thickness of the upper touch electrode and a thickness of the second pad electrode is thinner than a thickness of the lower touch electrode.

6. The display device of claim 4, further comprising:
a touch insulating layer on the upper touch layer,
wherein each of a thickness of the upper touch electrode and a thickness of the second pad electrode is thinner than a thickness of the lower touch electrode.

7. The display device of claim 4, further comprising:
a first touch insulating layer between the light emitting element and the lower touch layer; and
a second touch insulating layer between the lower touch layer and the upper touch layer,
wherein the first touch insulating layer and the second touch insulating layer are sequentially stacked on the passivation layer in the pad area, and expose the central portion of the third pad electrode.

8. The display device of claim 7, each of the passivation layer, the first touch insulating layer, and the second touch insulating layer includes an inorganic insulating material.

9. The display device of claim 7, each of the passivation layer and first touch insulating layer includes an inorganic insulating material, and the second touch insulating layer includes an organic insulating material.

10. The display device of claim 1, wherein the third conductive layer further includes:
a third pad electrode between the first pad electrode and the second pad electrode, and in contact with the first pad electrode, and
wherein the fourth conductive layer further includes:
a fourth pad electrode between the second pad electrode and the third pad electrode, and in contact with the second pad electrode and the third pad electrode.

11. The display device of claim 10, further comprising:
a lower touch layer between the upper touch layer and the light emitting element and including a lower touch electrode connected to the upper touch electrode.

12. The display device of claim 11, wherein each of a thickness of the upper touch electrode and a thickness of the second pad electrode is thinner than a thickness of the lower touch electrode.

13. The display device of claim 11, further comprising:
an insulating layer on the upper touch layer,
wherein each of a thickness of the upper touch electrode and a thickness of the second pad electrode is greater than a thickness of the lower touch electrode.

14. The display device of claim 11, further comprising:
a first touch insulating layer between the light emitting element and the lower touch layer, and
a second touch insulating layer between the lower touch layer and the upper touch layer,
wherein the first touch insulating layer and the second touch insulating layer cover both side portions of the fourth pad electrode, and expose a central portion of the fourth pad electrode in the pad area, and
wherein the first pad electrode is in contact with the central portion of the fourth pad electrode.

15. The display device of claim 14, each of the first touch insulating layer and the second touch insulating layer includes an inorganic insulating material.

16. The display device of claim 14, the first touch insulating layer includes an inorganic insulating material, and the second touch insulating layer includes an organic insulating material.

17. The display device of claim 10, further comprising:
an insulating layer between the fourth conductive layer and the light emitting element,
wherein the insulating layer covers both side portions of the fourth pad electrode in the pad area, and exposes a central portion of the fourth pad electrode, and
wherein the second pad electrode is in contact with the central portion of the fourth pad electrode.

18. The display device of claim 17, further comprising:
a lower touch layer between the upper touch layer and the light emitting element and including a lower touch electrode connected to the upper touch electrode;
a first touch insulating layer between the light emitting element and the lower touch layer; and
a second touch insulating layer between the lower touch layer and the upper touch layer,
wherein the first touch insulating layer and the second touch insulating layer expose the central portion of the fourth pad electrode in the pad area.

19. The display device of claim 1, further comprising:
an integrated circuit electrically connected to the second pad electrode, wherein the integrated circuit and the second pad electrode are electrically connected to each other by a conductive film.

20. The display device of claim 1, wherein the first conductive layer further includes: a first capacitor electrode, further comprising:

a fifth conductive layer between the first conductive layer and the second conductive layer, and including a second capacitor electrode overlapping the first capacitor electrode.

* * * * *